United States Patent
Bendat et al.

(10) Patent No.: US 6,651,866 B2
(45) Date of Patent: Nov. 25, 2003

(54) PRECISION BOND HEAD FOR MOUNTING SEMICONDUCTOR CHIPS

(75) Inventors: Zvi Bendat, New York, NY (US); Felix Zeigerman, Morganville, NJ (US)

(73) Assignee: Lilogix, Inc., Londonderry, NH (US)

( * ) Notice: Subject to any disclaimer, the term of this patent is extended or adjusted under 35 U.S.C. 154(b) by 0 days.

(21) Appl. No.: 09/981,352

(22) Filed: Oct. 17, 2001

(65) Prior Publication Data

US 2003/0071106 A1 Apr. 17, 2003

(51) Int. Cl.[7] ............... B23K 37/02; B23K 20/12; B23Q 15/00; B23P 19/00
(52) U.S. Cl. ............... 228/45; 228/2.1; 228/10; 29/740; 29/840
(58) Field of Search ............... 228/45, 1.1, 2.1, 228/2.3, 3.1, 10; 29/740, 840, 721, 790

(56) References Cited

U.S. PATENT DOCUMENTS

| | | | |
|---|---|---|---|
| 3,486,677 A | | 12/1969 | Avedissian |
| 3,641,660 A | | 2/1972 | Adams et al. |
| 3,738,560 A | * | 6/1973 | Kulicke et al. ............... 228/10 |
| 4,796,357 A | * | 1/1989 | Smith ............... 29/840 |
| 4,869,626 A | | 9/1989 | Kosmowski |
| 4,876,791 A | * | 10/1989 | Michaud et al. ............... 29/840 |
| 4,899,921 A | | 2/1990 | Bendat et al. |
| 5,172,922 A | * | 12/1992 | Kowaleski et al. ............... 279/3 |
| 5,308,132 A | | 5/1994 | Kirby et al. |
| 5,420,488 A | | 5/1995 | Gutman |
| 5,422,554 A | | 6/1995 | Rohde |
| 5,544,411 A | * | 8/1996 | Kano et al. ............... 29/740 |
| 5,556,022 A | | 9/1996 | Orcutt et al. |
| 5,600,189 A | | 2/1997 | Van Geel et al. |
| 5,680,698 A | | 10/1997 | Armington et al. |
| 6,170,731 B1 | * | 1/2001 | Hofius et al. ............... 228/2.1 |
| 6,463,359 B2 | * | 10/2002 | Fischer ............... 700/254 |
| 6,474,710 B2 | * | 11/2002 | Bendat et al. ............... 294/64.1 |

FOREIGN PATENT DOCUMENTS

| | | |
|---|---|---|
| EP | 0808087 | 11/1997 |
| EP | 1075174 | 2/2001 |
| JP | 11154692 | 6/1999 |
| JP | 11287211 | 10/1999 |

* cited by examiner

Primary Examiner—Tom Dunn
Assistant Examiner—L. Edmondson
(74) Attorney, Agent, or Firm—McCarter & English, LLP

(57) ABSTRACT

The present invention relates to a new and improved device adapted for mounting semiconductor components to substrates. More particularly, the device includes a housing and a first member rotatably mounted to the housing. A first interface is formed between the first member and the housing. The device also has a second member mounted in the first member and movable in an axial direction relative to the first member between a first position and a second position. The second member has an engaging mechanism at an end thereof for engaging a semiconductor component. A second interface is formed between the first and second members. The device is also provided with a supplying mechanism for supplying pressurized air to the first and second interfaces so as to form a first air bearing at the first interface and a second air bearing at the second interface.

23 Claims, 5 Drawing Sheets

PRECISION BOND HEAD FOR MOUNTING SEMICONDUCTOR CHIPS

FIELD OF THE INVENTION

The present invention relates to a bond head adapted for use in mounting semiconductor chips or components to substrates and, more particularly, to a bond head equipped with air bearings for enhancing its precision.

BACKGROUND OF THE INVENTION

Semiconductor chip mounting apparatus typically has an upper chuck and/or a lower chuck for mounting semiconductor chips or components to substrates. More particularly, the upper chuck is typically adapted to pick up a semiconductor chip and to position same in proper orientation relative to a substrate placed on the lower chuck. After proper alignment, the upper chuck moves toward the lower chuck for placing and/or bonding the semiconductor chip to the substrate. The upper chuck and/or the lower chuck are typically equipped with mechanical bearings for permitting relative movement of its components (see, e.g., U.S. Pat. No. 4,899,921). The use of these mechanical bearings can compromise the high precision/accuracy required for mounting/bonding semiconductor chips to substrates.

U.S. Pat. No. 5,308,132 relates to a circuit assembly device having an end effector for picking and placing component parts. The end effector is equipped with a piston movably coupled to an air bearing. Similarly, U.S. Pat. No. 5,600,189 discloses a machine for picking up, holding, moving and positioning electronic components to a printed circuit board. The machine includes an electromagnetic actuator equipped with an air bearing. While the devices disclosed in these patents are equipped with air bearings, they are not adapted for precise and accurate mounting of semiconductor chips to substrates.

SUMMARY OF THE INVENTION

The present invention overcomes the disadvantages and shortcomings of the prior art discussed above by providing a new and improved device adapted for mounting semiconductor components to substrates. More particularly, the device includes a housing and a first member rotatably mounted to the housing. A first interface is formed between the first member and the housing. The device also has a second member mounted in the first member. The second member is movable in an axial direction relative to the first member between a first position, in which the second member extends from the first member, and a second position, in which the second member is retracted from the first position. The second member has an engaging mechanism at an end thereof for engaging a semiconductor component when the second member is in its first position. A second interface is formed between the first and second members. The device is also provided with a supplying mechanism for supplying pressurized air to the first and second interfaces so as to form a first air bearing at the first interface and a second air bearing at the second interface. The first air bearing is sized and shaped so as to permit substantially frictionless rotational movement of the first member relative to the housing, while the second air bearing is sized and shaped so as to permit substantially frictionless rectilinear movement of the second member relative to the first member.

BRIEF DESCRIPTION OF THE DRAWINGS

For a more complete understanding of the present invention, reference is made to the following detailed description of an exemplary embodiment considered in conjunction with the accompanying drawings, in which.

DETAILED DESCRIPTION OF THE EXEMPLARY EMBODIMENT

Figure 1:
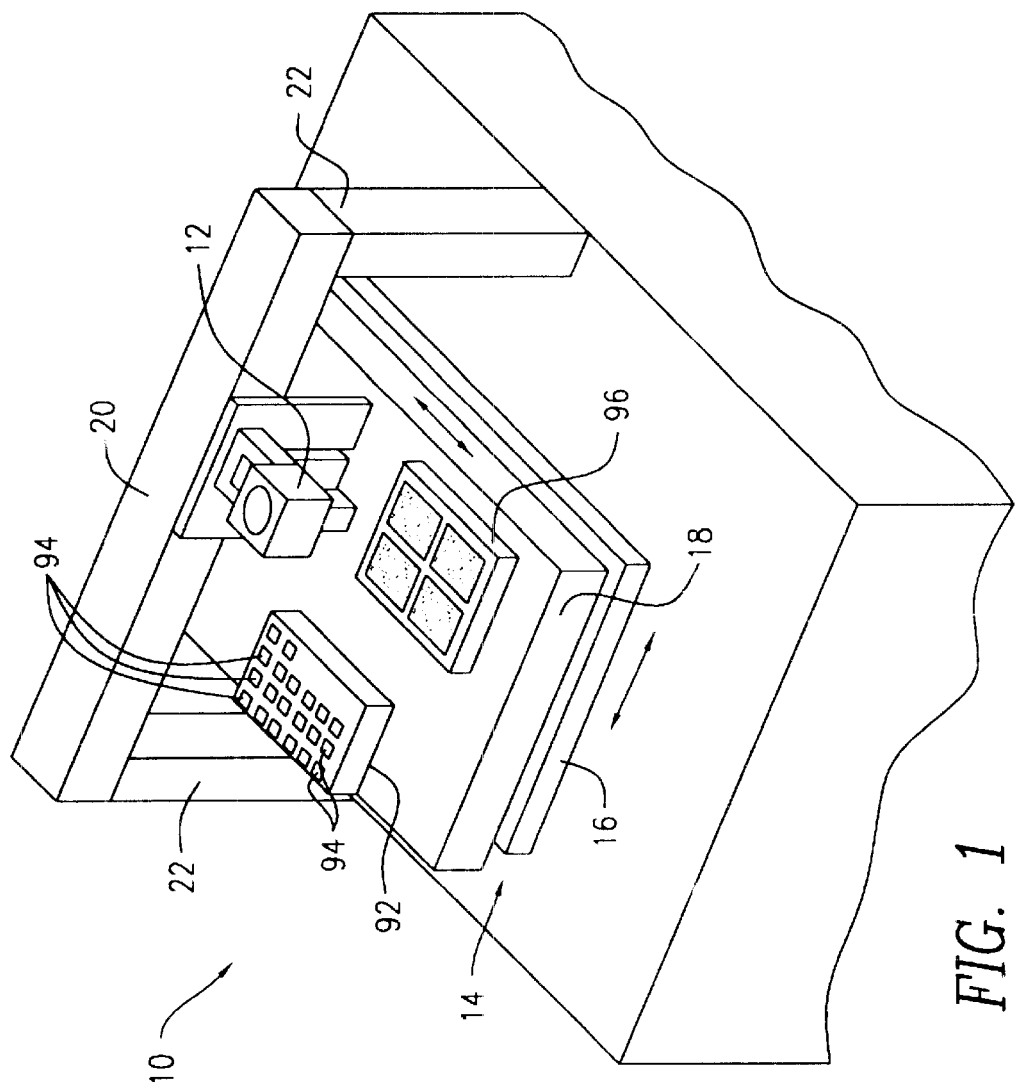
FIG. 1 is a perspective view of chip bonding apparatus equipped with a bond head constructed in accordance with the present invention.

FIG. 1 shows a chip bonding or mounting apparatus 10 (referred to hereinafter as "the bonding apparatus") which is equipped with a bond head 12 constructed in accordance with the present invention. More particularly, the bonding apparatus 10 includes an X-Y table assembly 14 mounted thereon and having X-axis and Y-axis tables 16, 18 which are movable in X-axis and Y-axis directions, respectively. The bonding apparatus 10 also includes a transverse support member 20 overlying the X-axis and Y-axis tables 16, 18, as well as vertical support members 22 for supporting the transverse support member 20 on the bonding apparatus 10. The transverse support member 20 is sized and shaped so as to support various components of the bonding apparatus 10.

Figure 2:
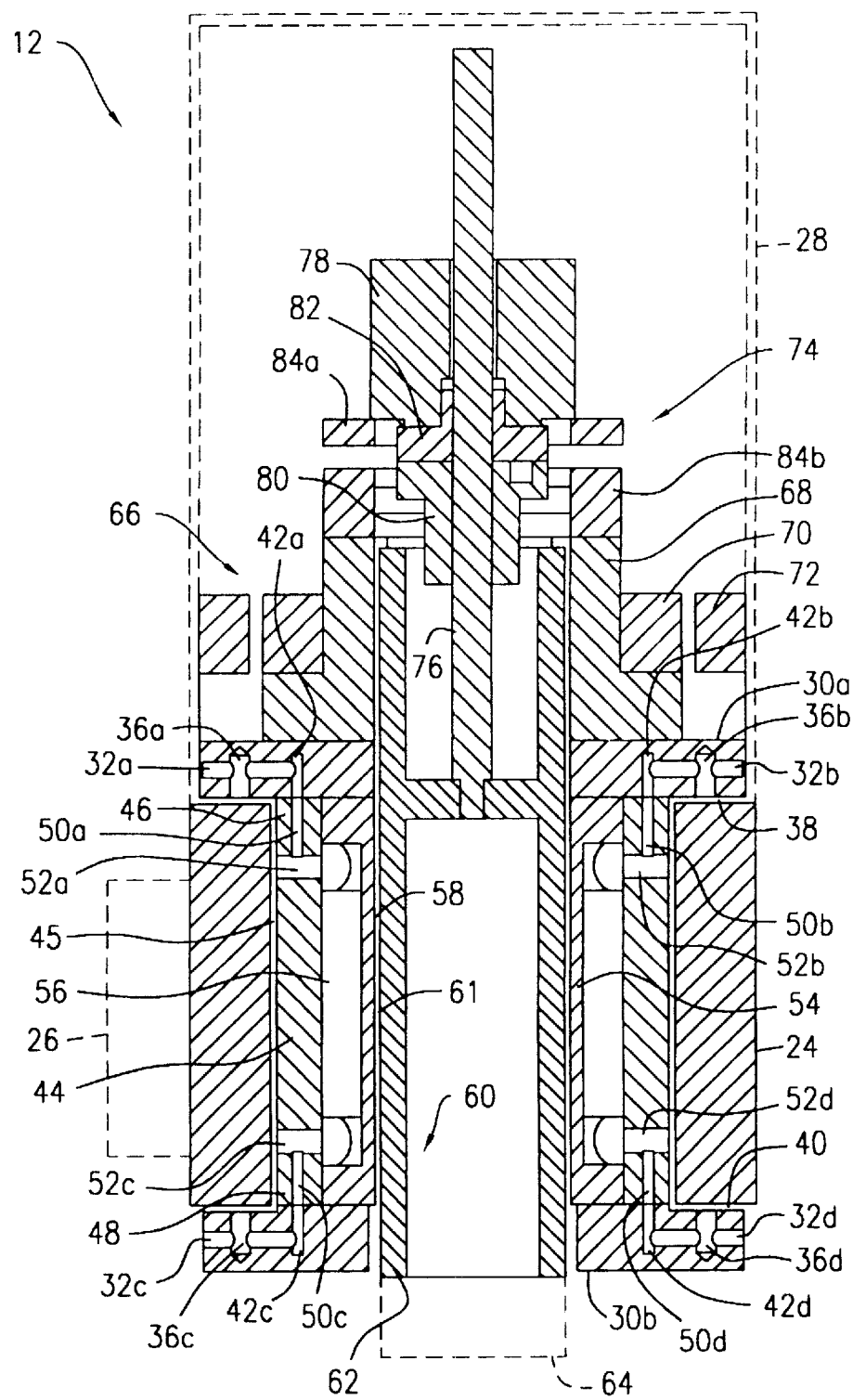
FIG. 2 is a cross-sectional view of the bond head shown in FIG. 1, a Z-housing of the bond head being in its retracted position.
Figure 5:
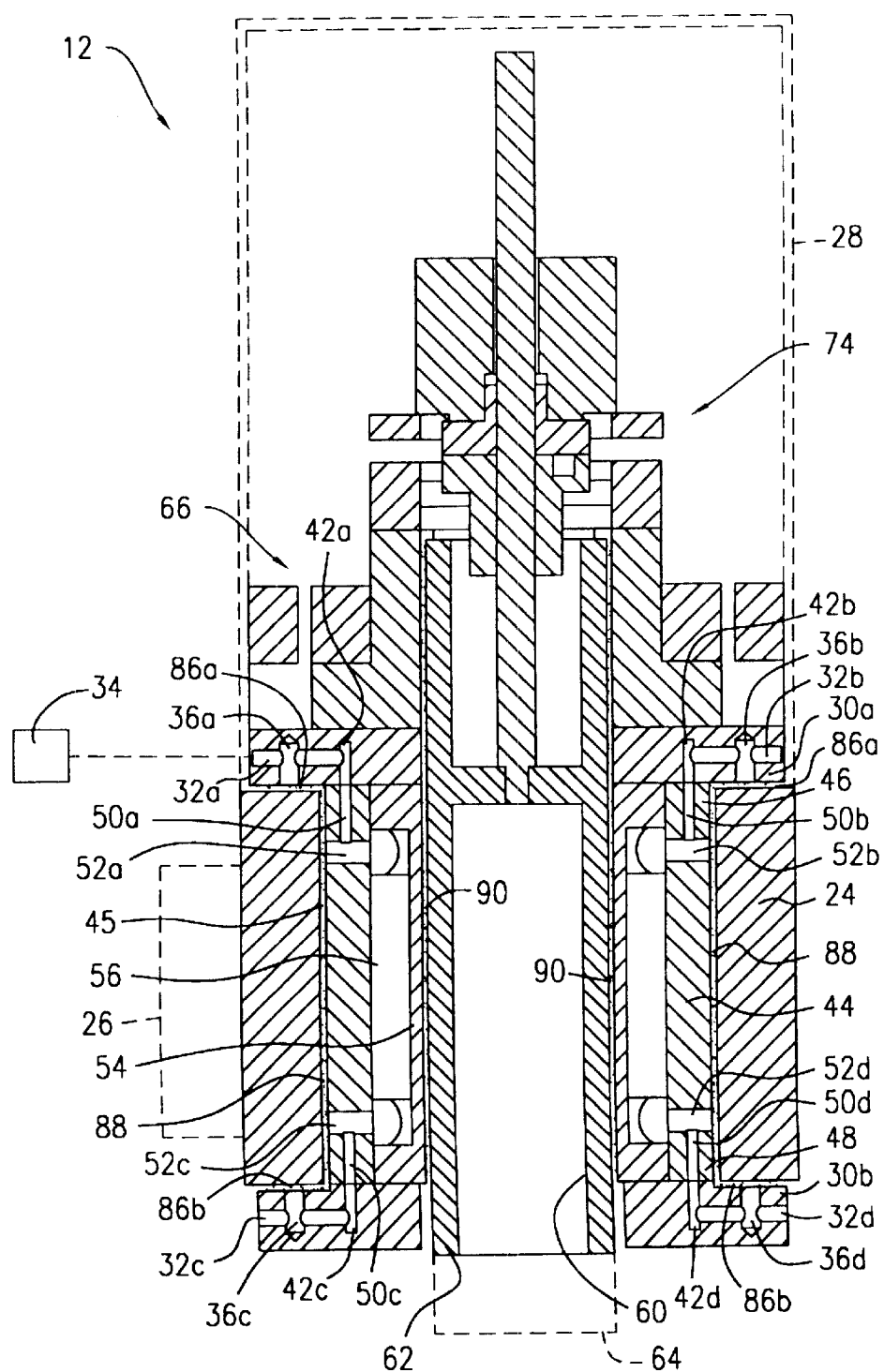
FIG. 5 is a schematic view of the bond head shown in FIGS. 1–4, illustrating its operation.

Referring primarily to FIGS. 1 and 2, the bond head 12, which is mounted to the transverse support member 20 of the bonding apparatus 10, has an outer housing 24 having a cylindrical opening therethrough. An adaptor plate 26 is attached to the outer housing 24 for attaching the bond head 12 to the transverse support member 20, while an open frame 28 projects from the outer housing 24 for purposes to be discussed hereinafter. The bond head 12 also includes upper and lower thrust plates 30a, 30b interposing the outer housing 24 therebetween. The upper thrust plate 30a has air supply channels or passages 32a, 32b formed therein, while the lower thrust plate 30b has air supply channels or passages 32c, 32d. The air supply channels 32a–32d are sized and shaped so as to be connected to an external pressurized air source 34 (see FIG. 5), such as an air pump, for forming air bearings within the bond head, as will be discussed in greater detail hereinafter. Air supply passages 36a, 36b are also formed in the upper thrust plate 30a and extend from the air supply channels 32a, 32b, respectively, downwardly for supplying pressurized air to an interface 38 formed between the upper thrust plate 30a and the outer housing 24. Similarly, air supply passages 36c, 36d are formed in the lower thrust plate 30b and extend upwardly from the air supply channels 32c, 32d, respectively, for supplying pressurized air to an interface 40 formed between the lower thrust plate 30b and the outer housing 24. Air supply passages 42a, 42b are also formed in the upper thrust plate 30a and communicate with the air supply channels 32a, 32b, respectively, while air supply passages 42c, 42d are formed in the lower thrust plate 30b and communicate with the air supply channels 32c, 32d, respectively.

Referring primarily to FIG. 2, a cylindrically shaped θ-housing 44 is rotatably mounted within the outer housing 24. As a result, an interface 45 is formed between the θ-housing 44 and the outer housing 24. The θ-housing 44, which has upper and lower ends 46, 48, is secured to the upper and lower thrust plates 30a, 30b for conjoint rotation therewith. The θ-housing 44 has a plurality of air supply channels or passages 50a, 50b projecting downwardly from the upper end 46, as well as a plurality of air supply passages 52a, 52b extending completely through the θ-housing 44 in a horizontal direction (i.e., in a direction substantially perpendicular to the longitudinal axis of the bond head 12). Similarly, air supply channels or passages 50c, 50d project upwardly from the lower end 48 of the θ-housing 44, while air supply passages 52c, 52d extend completely through the θ-housing 44 in the horizontal direction. The air supply channels 50a–50d of the θ-housing 44 are in communication with the air supply passages 42a, 42b and the air supply passages 42c, 42d, respectively, of the upper and lower thrust plates 30a, 30b respectively. The air supply channels 50a–50d are also in communication with the air supply passages 52a–52d, respectively, of the θ-housing 44.

Figure 4:
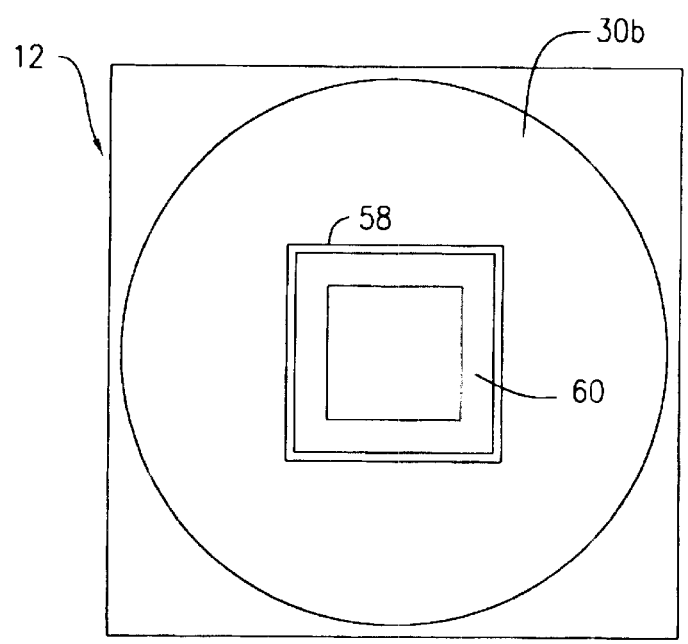
FIG. 4 is a bottom plan view of the bond head shown in FIGS. 1–3.

With reference to FIGS. 2 and 4, a cylindrically shaped sleeve or journal 54 is mounted within and affixed to the θ-housing 44. As a result, the sleeve 54 is adapted for conjoint rotational movement along with the θ-housing 44, as well as the upper and lower thrust plates 30a, 30b. The sleeve 54, which is made from a porous graphite material, has an annular space 56 formed in the sleeve 54 and communicating with the air supply passages 52a–52d of the θ-housing 44 for serving as an air reservoir. More particularly, the space 56 is formed along the entire circumference of the sleeve 54 (i.e., formed completely around the sleeve 54) and extends in an axial or Z-axis direction (i.e., in a direction substantially parallel to the longitudinal axis of the bond head 12) along a substantial portion of the sleeve 54. An opening 58 is formed in the sleeve 54, extending in the axial direction. The opening 58 has a non-circular (e.g., rectangular) cross-sectional shape (see FIG. 4) for purposes to be discussed hereinafter.

Still referring to FIGS. 2 and 4, the bond head 12 is also equipped with a Z-housing 60. More particularly, the Z-housing 60 is sized and shaped so as to be slidably mounted within the sleeve 54. More particularly, the Z-housing 60 has a cross-sectional shape which conforms to the cross-sectional shape of the opening 58 of the sleeve 54 (see FIG. 4) such that the Z-housing 60 is movable rectilinearly in the axial or Z-axis direction but is inhibited from rotating relative to the sleeve 54 and hence the θ-housing 44. The Z-housing 60 is movable between a retracted position, in which the Z-housing 60 is positioned substantially within the sleeve 54 (see FIG. 2), and an extended position, in which the Z-housing 60 projects downwardly from the sleeve 54 (see FIG. 3). An interface 61 is formed between the Z-housing 60 and the sleeve 54. The Z-housing 60 also has a bottom end 62 which is sized and shaped so as to accommodate a pick-up tool 64 for picking up and/or engaging semiconductor chips.

Figure 3:
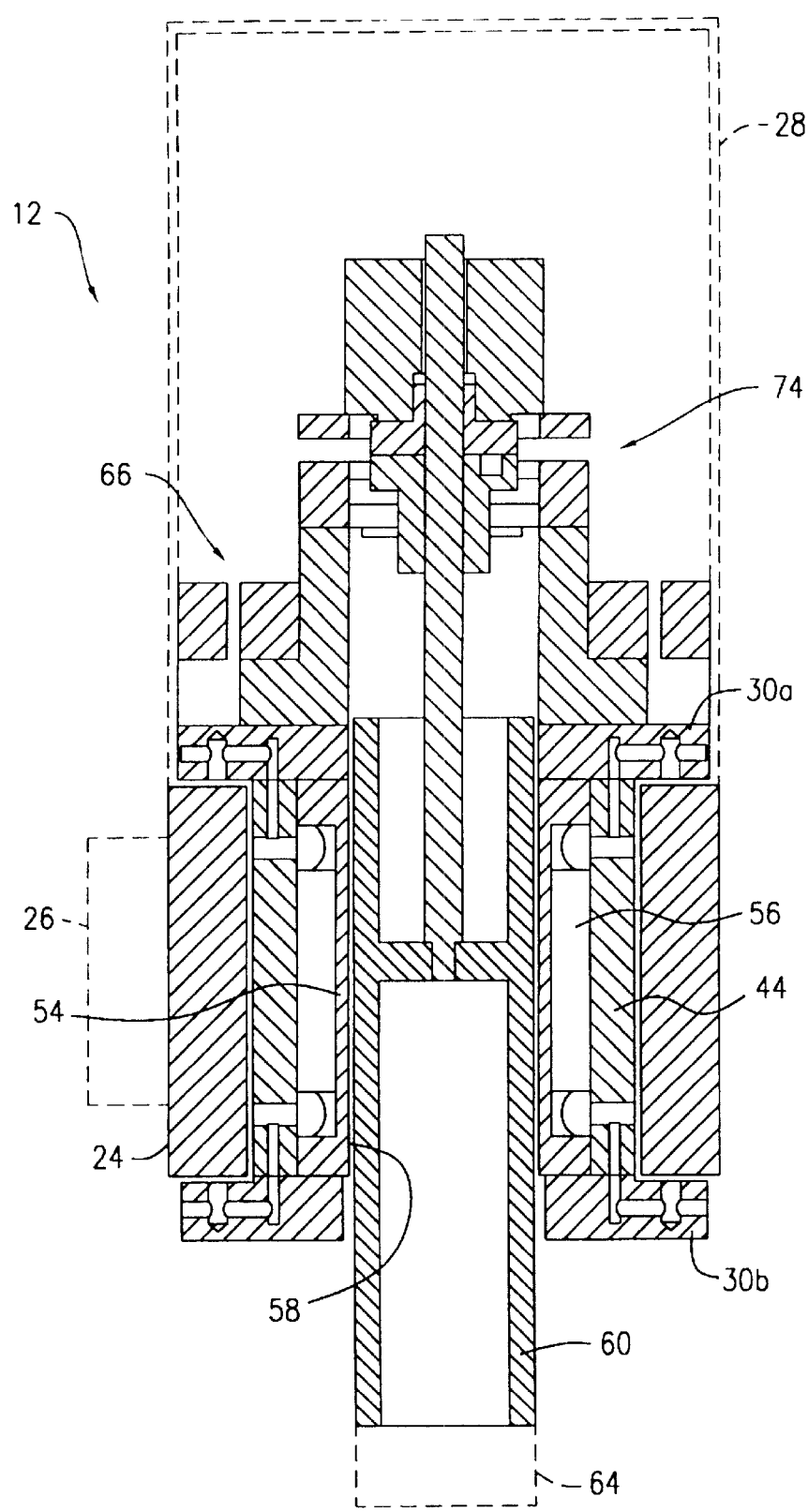
FIG. 3 is a view similar to FIG. 2, except that the Z-housing of the bond head is in its extended position.

Now referring to FIGS. 2 and 3, a servo motor mechanism 66 is mounted on the bond head 12 for rotating the θ-housing assembly (i.e., the θ-housing 44, the upper and lower thrust plates 30a, 30b and the sleeve 54) and hence the Z-housing 60. More particularly, the servo motor mechanism 66 includes a servo motor housing 68 attached to the upper thrust plate 30a. The servo motor mechanism 66 also includes a rotor 70, which is mounted to the servo motor housing 68, and a stator 72 attached to the open frame 28 of the bond head 12 for causing the rotor 70 to rotate.

A Z-housing moving mechanism 74 is provided for causing the Z-housing 60 to move in the axial or Z-axis direction between its retracted and extended positions (see FIGS. 2 and 3). The moving mechanism 74 includes a ball screw 76 projecting from an end of the Z-housing 60. A stepper motor actuator 78 is provided for actuating the ball screw 76. More particularly, the actuator 78 is equipped with a ball nut 80, which is adapted to engage the ball screw 76, and a ball nut adapter 82 for attaching the ball nut 80 to the actuator 78. Upper and lower flexible motor mounting plates 84a, 84b are positioned between the actuator 78 and the servo motor housing 68 for properly aligning and/or positioning the actuator 78.

In operation, pressurized air is supplied from the pressurized air source 34 (see FIG. 5) to the air supply passages 36a, 36b of the upper thrust plate 30a and the air supply passages 36c, 36d of the lower thrust plate 30b through the air source channels 32a–32d, respectively. As a result, air bearings 86a, 86b (see FIG. 5) are formed at the interface 38 between the upper thrust plate 30a and the outer housing 24 and at the interface 40 between the lower thrust plate 30b and the outer housing 40, respectively. The pressurized air is also supply to the air supply passage 52a–52d of the θ-housing 44 from the air supply channels 32a–32d, respectively, of the upper and lower thrust plates 30a, 30b through the air supply passages 42a–42d, respectively, of the upper and lower thrust plates 30a, 30b and the air supply channels 50a–50d, respectively, of the θ-housing 44. A portion of the pressurized air is fed from the air supply passages 52a–52d to the interface 45 between the θ-housing 44 and the outer housing 24 so as to form an air bearing 88 (see FIG. 5) at the interface 45 between the θ-housing 44 and the outer housing 24. Because of the air bearings 86a, 86b, 88, the θ-housing assembly is adapted for substantially frictionless rotational movement relative to the outer housing 24. The remaining portion of the pressurized air is fed from the air supply passages 52a–52d to the space 56 of the sleeve 54. Because the sleeve 54 is made from a porous graphite material, the pressurized air is supplied from the space 56 to the interface 61 between the sleeve 54 and the Z-housing 60 through the sleeve 54. As a result, an air bearing 90 (see FIG. 5) is formed at the interface 61 between the sleeve 54 and the Z-housing 60 for permitting substantially frictionless movement of the Z-housing 60 relative to the θ-housing assembly along the axial or Z-axis direction.

Subsequent to the formation of the air bearings 86a, 86b, 88, 90, the servo motor mechanism 66 and the Z-housing moving mechanism 74 are independently and selectively operated, either automatically by a computer (not shown) or manually by an operator, to control the rotational movement of the θ-housing assembly and the axial movement of the Z-housing 60. More particularly, after the X-Y table assembly 14 positions waffle packs 92 (see FIG. 1) below the bond head 12, the Z-housing 60 is moved downwardly in the Z-axis direction so as to pick up a semiconductor chip 94 (see FIG. 1) from one of the waffle packs 92. After picking up the semiconductor chip 94, the Z-housing 60 is retracted upwardly. The X-Y table assembly 14 then positions a substrate 96 (see FIG. 1) placed thereon below the bond head 12. The θ-housing assembly is rotated so as to properly adjust the angular orientation of the semiconductor chip 94 picked up by the bond head 12 relative to the substrate 96. Next, the Z-housing 60 is moved downwardly in the Z-axis direction so as to place and/or "tack" the semiconductor chip 94 on the substrate 96 and is then moved upwardly.

It should be appreciated that the present invention provides numerous advantages over the conventional devices discussed above. For instance, because of the air bearings 86a, 86b, 88, 90, high precision and/or accuracy can be achieved in mounting semiconductor chips to substrates. More particularly, due to the absence of any mechanical linkage between the θ-housing assembly and the outer housing 24 and between the θ-housing assembly and the Z-housing 60, the θ-housing assembly and the Z-housing 60 are adapted for highly uniform movement, hence promoting precise and accurate placement of semiconductor chips to substrates.

It should be noted that the present invention can have numerous modifications and variations. For instance, while the bond head 12 is especially suitable for use in mounting flip chips to substrates, it can be used in conjunction with any types of semiconductor chips. Moreover, the sleeve 54 can be eliminated and/or replaced with other mechanisms (e.g., a non-porous sleeve having air supply channels or passages). The upper and lower thrust plates 30a, 30b can also be eliminated or replaced with other mechanisms. Likewise, the air supply system of the bond head 12 can be modified in a number of different ways to supply pressurized air to the interface (i.e., the interfaces 38, 40, 45) between the θ-housing assembly and the outer housing 24 and the interface 61 between the Z-housing 60 and the θ-housing assembly. Further, the servo motor mechanism 66 and/or the Z-housing moving mechanism 74 can be replaced with any similar mechanisms. The pick-up tool 64 can also be in the form of any conventional pick-up tools or chucks.

It will be understood that the embodiment described herein is merely exemplary and that a person skilled in the art may make many variations and modifications without departing from the spirit and scope of the invention. All such variations and modifications, including those discussed above, are intended to be included within the scope of the invention as defined in the appended claims.

We claim:

1. A device adapted for mounting semiconductor components to substrates, comprising a housing; a first member rotatably mounted in said housing, said first member and said housing forming a first interface therebetween; a second member mounted in said first member and movable in an axial direction relative to said first member between a first position, in which said second member extends from said first member, and a second position, in which said second member is retracted from said first position, said second member having engaging means at an end thereof for engaging a semiconductor component when said second member is in its said first position, said first and second members forming a second interface therebetween and supplying means for supplying pressurized air to said first and second interfaces so as to form a first air bearing at said first interface and a second air bearing at said second interface, said first air bearing being sized and shaped so as to permit substantially frictionless rotational movement of said first member relative to said housing, and said second air bearing being sized and shaped so as to permit substantially frictionless rectilinear movement of said second member relative to said first member.

2. The device of claim 1, wherein said supplying means includes a passage system formed in said first member, said passage system being connectable to a pressurized air source so as to supply pressurized air to said first and second interfaces.

3. The device of claim 2, wherein said second member is rotatable conjointly with said first member such that the angular orientation of a semiconductor component engaged by said engaging means can be adjusted relative to a substrate positioned below said engaging means.

4. The device of claim 3, wherein said first member includes a rotatable member, which is rotatably mounted within said housing, and a sleeve member, which is mounted within said rotatable member for conjoint rotation with said rotatable member relative to said housing, said second member movably positioned in said sleeve member.

5. The device of claim 4, wherein said first member includes upper and lower plates attached to said rotatable member for conjoint rotation with said rotatable member relative to said housing, said upper and lower plates interposing said housing therebetween.

6. The device of claim 5, wherein said first interface includes a third interface, which is formed between said upper plate and said housing, and a fourth interface, which is formed between said lower plate and said housing, said passage system being constructed so as to supply pressurized air to said third and fourth interfaces.

7. The device of claim 6, wherein said first interface includes a fifth interface formed between said rotatable member and said housing, said passage system being constructed so as to supply pressurized air to said fifth interface.

8. The device of claim 7, wherein said second interface is formed between said sleeve member and said second member.

9. The device of claim 8, wherein said rotatable member and said sleeve member are retained in said housing between said upper and lower plates.

10. The device of claim 7, wherein said passage system includes an annular space formed in said sleeve member for receiving pressurized air conveyed thereto, said sleeve member being constructed so as to permit passage of pressurized air from said space to said second interface.

11. The device of claim 10, wherein said passage system includes a first passage, which is formed in said upper plate and sized and shaped so as to be connected to a pressurized air source, and a second passage, which is formed in said upper plate and which communicates with said first passage and said third interface so as to supply pressurized air from said first passage to said third interface.

12. The device of claim 11, wherein said passage system includes a third passage, which is formed in said lower plate and sized and shaped so as to be connected to the pressurized air source, and a fourth passage, which is formed in said lower plate and which communicates with said third passage and said fourth interface so as to supply pressurized air from said third passage to said fourth interface.

13. The device of claim 12, wherein said passage system includes a fifth passage, which is formed in said upper plate and which communicates with said first passage for receiving pressurized air from said first passage, and a sixth passage, which is formed in said lower plate and which communicates with said third passage for receiving pressurized air from said third passage.

14. The device of claim 13, wherein said passage system includes a seventh passage, which is formed in said rotatable member and which communicates with said fifth passage for receiving pressurized air from said fifth passage, and an eighth passage, which is formed in said rotatable member and which communicates with said seventh passage, said fifth interface and said space so as to supply pressurized air to said fifth interface and said space.

15. The device of claim 14, wherein said passage system includes a ninth passage, which is formed in said rotatable member and which communicates with said sixth passage for receiving pressurized air from said sixth passage, and a tenth passage, which is formed in said rotatable member and which communicates with said ninth passage, said fifth interface and said space so as to supply pressurized air to said fifth interface and said space.

16. The device of claim 5, further comprising rotating means for independently and selectively rotating said first member relative to said housing.

17. The device of claim 16, wherein said rotating means includes a motor having a rotor and a stator which cooperate with one another so as to rotate said first member.

18. The device of claim 17, wherein said rotating means includes a motor housing attached to said upper plate for conjoint rotation therewith, said rotor being mounted to said motor housing.

19. The device of claim 18, further comprising moving means for moving said second member in said axial direction relative to said first member.

20. The device of claim 19, wherein said moving means includes a screw, which extends from said second member, and an actuator mounted to said motor housing for engaging said screw.

21. The device of claim 4, wherein said sleeve member is constructed so as to permit passage of pressurized air therethrough for forming said second air bearing between said sleeve member and said third member.

22. The device of claim 21, wherein said sleeve member is made from a porous material.

23. A device adapted for mounting semiconductor components to substrates, comprising a housing; a first member rotatably mounted in said housing, said first member and said housing forming a first interface therebetween, said first member including a rotatable member, which is rotatably mounted in said housing, and a sleeve member, which is mounted within said rotatable member for conjoint rotation with said rotatable member relative to said housing; a second member positioned in said sleeve member and movable in an axial direction relative to said first member between a first position, in which said second member extends from said first member, and a second position, in which said second member is retracted from said first position, said second member having engaging means at an end thereof for engaging a semiconductor component when said second member is in its said first position, said second member being rotatable conjointly with said first member such that the angular orientation of a semiconductor component engaged by said engaging means can be adjusted relative to a substrate positioned below said engaging means, said first and second members forming a second interface therebetween; and supplying means for supplying pressurized air to said first and second interfaces so as to form a first air bearing at said first interface and a second air bearing at said second interface, said first air bearing being sized and shaped so as to permit substantially frictionless rotational movement of said first member relative to said housing, and said second air bearing being sized and shaped so as to permit substantially frictionless rectilinear movement of said second member relative to said first member, said supplying means including a passage system formed in said first member, said passage system being connectable to a pressurized air source so as to supply pressurized air to said first and second interfaces, said sleeve member being made from a porous graphite material so as to permit passage of pressurized air therethrough for forming said second air bearing between said sleeve member and said third member.

\* \* \* \* \*